United States Patent
Cho et al.

(10) Patent No.: US 9,240,570 B2
(45) Date of Patent: Jan. 19, 2016

(54) ORGANIC LIGHT-EMITTING DEVICE AND METHOD OF FABRICATING THE SAME

(71) Applicant: SNU R&DB FOUNDATION, Seoul (KR)

(72) Inventors: Hyunduck Cho, Anyang-si (KR); Jeongkyun Roh, Seoul (KR); Hyunkoo Lee, Seoul (KR); Changhee Lee, Seoul (KR); Yong Taek Hong, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 296 days.

(21) Appl. No.: 13/761,661

(22) Filed: Feb. 7, 2013

(65) Prior Publication Data

US 2013/0207089 A1   Aug. 15, 2013

(30) Foreign Application Priority Data

Feb. 10, 2012   (KR) .................. 10-2012-0013747

(51) Int. Cl.
*H01L 51/52*   (2006.01)
*H01L 51/00*   (2006.01)
*H01L 51/56*   (2006.01)

(52) U.S. Cl.
CPC ........ *H01L 51/5296* (2013.01); *H01L 51/0004* (2013.01); *H01L 51/56* (2013.01)

(58) Field of Classification Search
CPC ....................................................... G09G 3/20
See application file for complete search history.

(56) References Cited

U.S. PATENT DOCUMENTS

| | | | |
|---|---|---|---|
| 6,538,374 B2* | 3/2003 | Hosokawa | 313/504 |
| 2006/0131568 A1* | 6/2006 | Meng et al. | 257/40 |
| 2007/0132365 A1* | 6/2007 | Kang et al. | 313/500 |
| 2009/0309492 A1* | 12/2009 | Hofmann et al. | 313/504 |
| 2010/0053039 A1* | 3/2010 | Park et al. | 345/76 |
| 2010/0155760 A1* | 6/2010 | Lee et al. | 257/98 |
| 2010/0163854 A1* | 7/2010 | Kho et al. | 257/40 |
| 2011/0031877 A1* | 2/2011 | Takada et al. | 313/504 |

* cited by examiner

*Primary Examiner* — Nathan T Leong
(74) *Attorney, Agent, or Firm* — Paratus Law Group, PLLC

(57) ABSTRACT

Provided is a method of fabricating an organic light-emitting device. The method of fabricating an organic light-emitting device includes: providing a substrate; forming a control electrode on the substrate; forming an insulating layer covering at least a top surface of the control electrode; forming a hole transport layer pattern through printing on at least a part of the insulating layer; forming an organic light-emitting layer to be in contact with at least a part of a surface of the hole transport layer pattern; forming an electron transport layer pattern through printing to be in contact with at least a part of a surface of the organic light-emitting layer; and forming a first electrode and a second electrode respectively on the hole transport layer pattern and the electron transport layer pattern.

26 Claims, 6 Drawing Sheets

ORGANIC LIGHT-EMITTING DEVICE AND METHOD OF FABRICATING THE SAME

CROSS-REFERENCE TO RELATED APPLICATION

This application claims priority to and the benefit of Korean Patent Application No. 2010-0013747, filed on Feb. 10, 2012, the disclosure of which is incorporated herein by reference in its entirety.

BACKGROUND

1. Field of the Invention

The present invention relates to a light-emitting device, and more particularly, to an organic light-emitting device.

2. Discussion of Related Art

An organic light-emitting device (OLED) such as an organic light-emitting diode is a light-emitting device using a light-emitting phenomenon due to electron-hole recombination generated in an organic light-emitting layer. The OLED can be operated at relatively low voltage of about 1 to 10V and made thin. The OLED provides unchangeable picture quality even when viewed from a location other than the front due to a wider viewing angle than a liquid crystal display (LCD), and does not leave an afterimage due to faster response speed than the LCD. In addition, it is possible to form the OLED on a flexible substrate, and thereby to implement a flexible display and a flexible electronic apparatus. However, the OLED may require a switching device such as thin film transistor for switching since it is not self-switched, and thereby switching speed may decrease. Further, since an additional process for forming the switching device is required, the manufacturing cost may increase.

To solve those problems, an organic light-emitting transistor (OLET) has been suggested. In the OLET, holes and electrons may each move according to a direction of an electric field and emit light due to recombination in the organic light-emitting layer. However, since the hole mobility is greater than the electron mobility, the recombination may occur not at the center between the electrodes but near an electron injection electrode. In this way, when the recombination occurs near the electron injection electrode, light-emitting efficiency may decrease since non-radiative recombination is predominant.

In addition, each layer is generally formed by a deposition method such as chemical vapor deposition (CVD), sputtering, evaporation, etc. in the OLET. However, such a method of forming the OLET requires that each process be performed in a vacuum chamber, and therefore cost may increase.

SUMMARY OF THE INVENTION

The present invention is directed to an organic light-emitting transistor having higher light-emitting efficiency than in a related art. Particularly, the present invention proposes a method of fabricating an organic light-emitting transistor at a lower cost than in a related art.

According to an aspect of the present invention, there is provided a method of fabricating an organic light-emitting device, including: providing a substrate, forming a control electrode on the substrate, forming an insulating layer covering at least a top surface of the control electrode, forming a hole transport layer pattern through printing on at least a part of the insulating layer, forming an organic light-emitting layer to be in contact with at least a part of a surface of the hole transport layer pattern, forming an electron transport layer pattern through printing to be in contact with at least a part of a surface of the organic light-emitting layer, and forming a first electrode and a second electrode respectively on the hole transport layer pattern and the electron transport layer pattern.

According to another aspect of the present invention, there is provided a method of fabricating an organic light-emitting device, including: providing a substrate, forming a control electrode on the substrate, forming an insulating layer covering at least a top surface of the control electrode, forming an electron transport layer pattern through printing on at least a part of the insulating layer, forming an organic light-emitting layer to be in contact with at least a part of a surface of the electron transport layer pattern, forming a hole transport layer pattern through printing to be in contact with at least a part of a surface of the organic light-emitting layer, and forming a first electrode and a second electrode respectively on the hole transport layer pattern and the electron transport layer pattern.

According to the embodiments as described above, effects including the following advantages may be obtained. However, the above-described embodiments are not meant to include all the advantages, and neither is the scope of the present invention limited by the following advantages.

According to the present embodiment, manufacturing costs and time may be reduced since the organic light-emitting device is fabricated by a printing method without going through a plurality of fabrication processes.

According to the present embodiment, light-emitting efficiency may increase since holes and electrons combine and emit light at a location spaced apart from an electron injection electrode.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
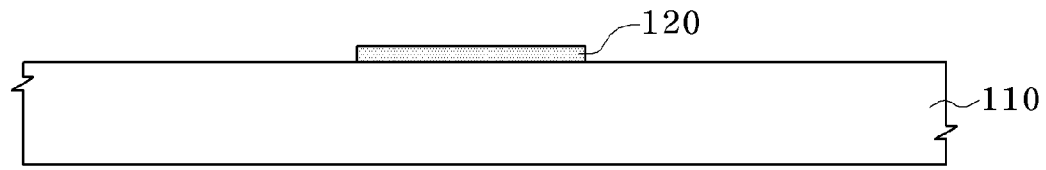
FIGS. 1 to 11 are cross-sectional views illustrating an overview of each process of fabricating an organic light-emitting device according to an embodiment of the present invention.

Example embodiments of the present invention are disclosed herein. However, specific structural and functional details disclosed herein are merely representative for purposes of describing example embodiments of the present invention, however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

In addition, the individual steps may be performed in an order that is different from that described in this specification not so long as the execution order of the steps is definitely specified. That is, the individual steps may be performed in the order described in this specification, substantially at the same time, or in the reverse order.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an embodiment of the present invention will be described with reference to the accompanying drawings. FIGS. 1 to 11 are cross-sectional views illustrating an overview of processes according to an embodiment of the present invention. Referring to FIG. 1, a substrate 110 is provided, and a control electrode 120 is formed on the substrate 110. In some embodiments, the substrate 110 may be a plastic substrate. In other embodiments, the substrate 110 may be a glass substrate. In still other embodiments, the substrate 110 may be a flexible substrate. The control electrode 120 functions to switch an organic light-emitting device (OLED) by applying an electric field to the OLED in order to switch the OLED which is to be formed in subsequent processes. In some embodiments, the control electrode 120 is formed of gold (Au). In other embodiments, the control electrode 120 is formed of silver (Ag). In still other embodiments, the control electrode 120 is formed of aluminum (Al). In still other embodiments, the control electrode 120 is formed of indium tin oxide (ITO).

Figure 2:
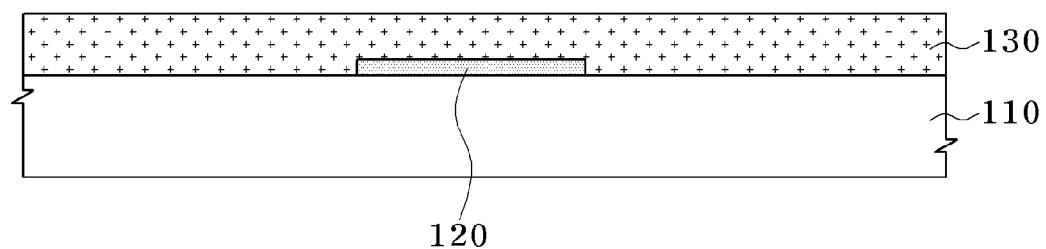

Referring to FIG. 2, an insulating layer 130 covering at least a top surface of the control electrode 120 is formed. The insulating layer 130 electrically separates the control electrode 120 from a hole transport layer 140 (See FIG. 6A) and an electron transport layer (See FIG. 8a) in order for the control electrode 120 to control the OLED by applying an electric field to the hole transport layer 140 or the electron transport layer 160. In some embodiments, the insulating layer 130 is formed of polystyrene (PS). In other embodiments, the insulating layer 130 is formed of polyvinylphenol (PVP). In still other embodiments, the insulating layer 130 is formed of polymethylmethacrylate (PMMA).

Figure 3:
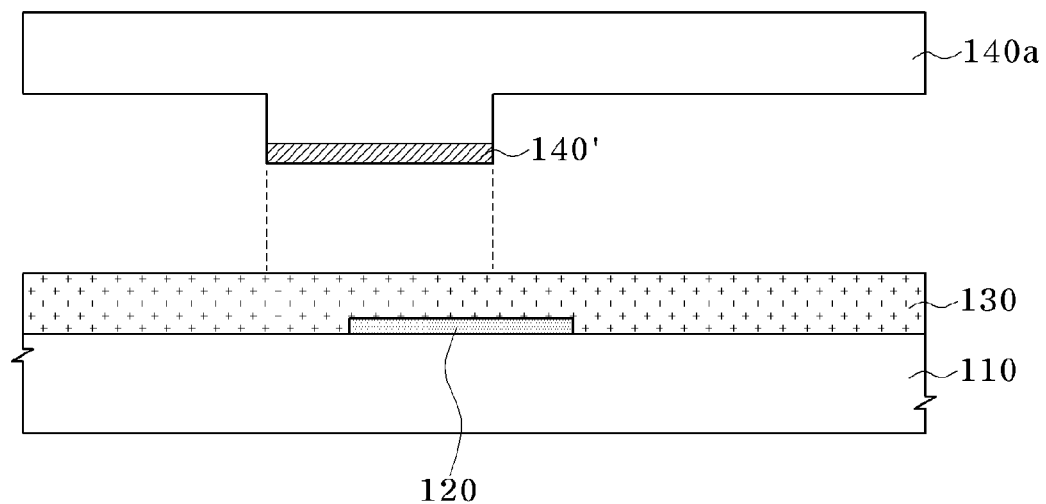
Figure 4:
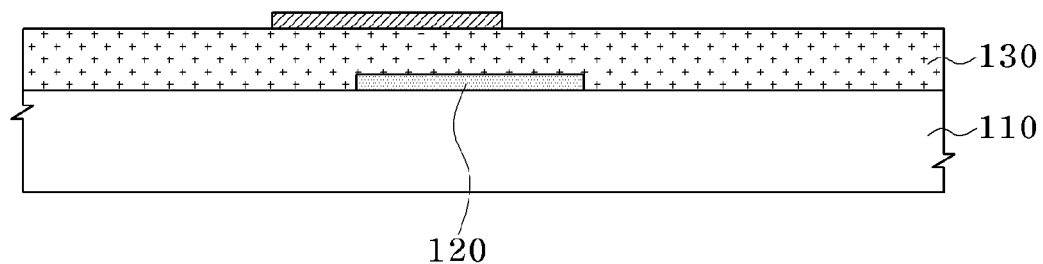

Referring to FIGS. 3 and 4, a hole transport layer pattern 140 is formed through printing on at least a part of the insulating layer 130. In some embodiments, the process of printing and forming the hole transport layer pattern 140 is performed by a transfer printing method in which a material 140' dissolved in an organic solvent to form the hole transport layer 140 is coated on a mold 140a and transferred to a top surface of the insulating layer 130. In other embodiments, the process of printing and forming the hole transport layer pattern 140 is performed, although not shown in the drawings, by an inkjet printing method in which the material 140' dissolved in an organic solvent to form the hole transport layer 140 is sprayed through a nozzle and printed. In still other embodiments, the process of printing and forming the hole transport layer pattern 140 is performed, although not shown in the drawings, by a roll-to-roll printing method in which the material 140' to form the hole transport layer 140 is coated on a roll and rolled on a surface on which the organic light emitting layer is to be printed. In some embodiments, the material 140' to form the hole transport layer 140 is small molecules such as 6,13-bis(triisopropylsilylethynyl)pentacene (TIPS-pentacene) dissolved in an organic solvent. In other embodiments, the material 140' to form the hole transport layer 140 is poly(3-hexylthiophene) (P3HT) dissolved in an organic solvent. In still other embodiments, the material 140' to form the hole transport layer 140 is a polymer such as poly(2,5-bis(3-tetradecylthiophen-2-yl)thieno[3,2-b]thiophene) (PBTTT) dissolved in an organic solvent.

Figure 5:
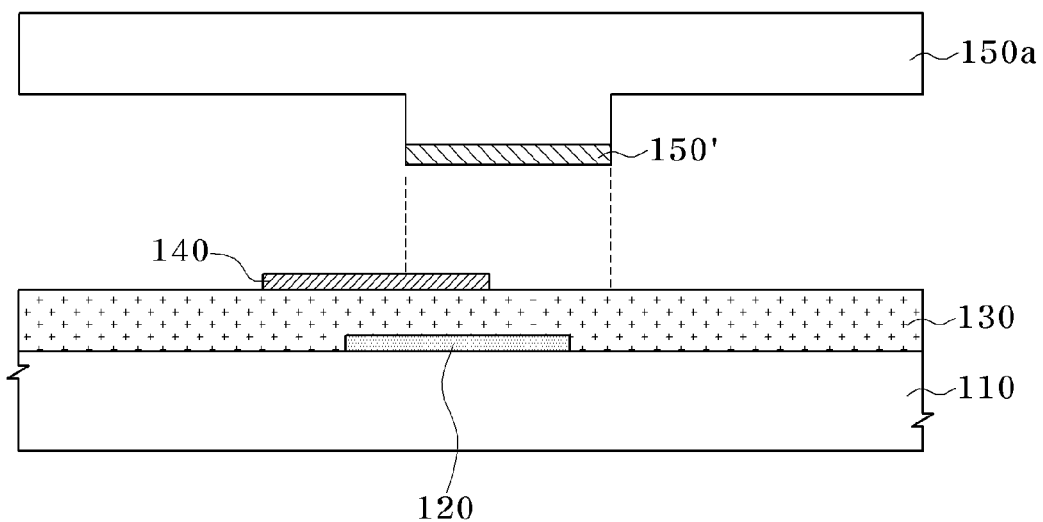
Figure 6A:
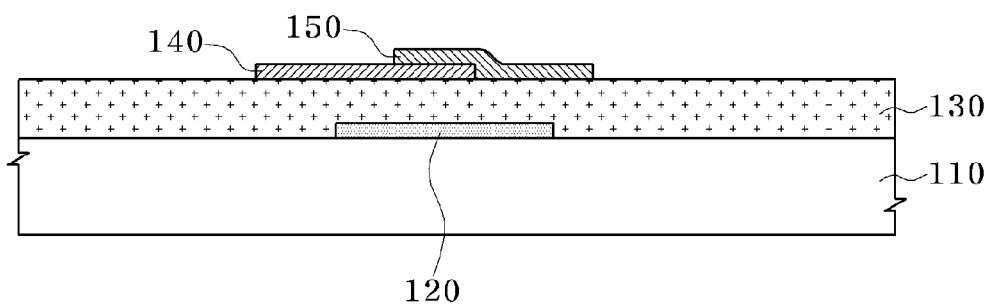
Figure 6B:
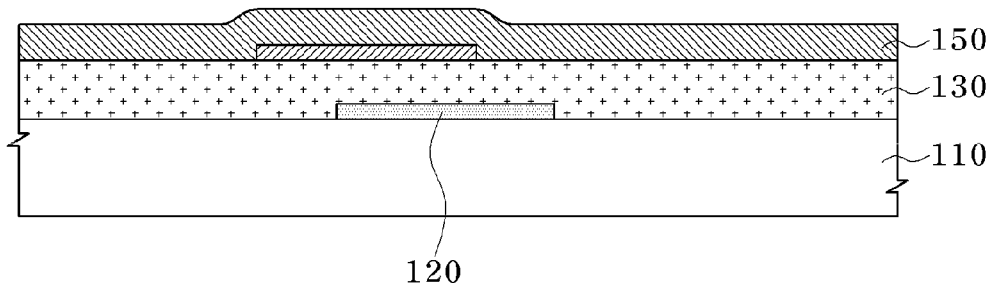

Referring to FIGS. 5 and 6, an organic light emitting layer 150 is formed to be in contact with at least a part of a surface of the hole transport layer pattern 140. In some embodiments, as shown in FIG. 5, the process of forming the organic light emitting layer 150 is performed by the transfer printing method in which a material 150' dissolved in an organic solvent to form the organic light emitting layer 150 is coated on a mold 150a and transferred to a location in which the organic light emitting layer 150 is to be formed. In other embodiments, the process of forming the organic light emitting layer 150 is performed, although not shown in the drawings, by the inkjet printing method in which the material 150' dissolved in an organic solvent to form the organic light emitting layer 150 is sprayed through a nozzle and forms the organic light emitting layer 150. In still other embodiments, the process of forming the organic light emitting layer 150 is performed, although not shown in the drawings, by a vacuum evaporation method. In still other embodiments, the process of forming the organic light emitting layer 150 is performed by a spin coating method. Spin coating is a method of forming a thin film of an organic light emitting layer through spinning. In still other embodiments, the process of forming the organic light emitting layer 150 is performed by a dip coating method. Dip coating is a method in which a substrate is dipped in a material dissolved in an organic solvent and drained to form the organic light emitting layer 150, wherein the thickness of the organic light emitting layer 150 is controlled by controlling the dipping time. In still other embodiments, the process of forming the organic light emitting layer 150 is performed by a doctor blade method. In this case, the thickness of the organic light emitting layer 150 may be kept constant by keeping the speed of a substrate and the pressure of a blade constant. In still other embodiments, the process of forming the organic light emitting layer 150 is performed, as described above, by the roll-to-roll method. In this case, the organic light emitting layer 150 may be formed on the entire surface of the resulting structure as shown in FIG. 6B, or only on a light emitting part in which the hole transport layer pattern 140 and the electron transport layer pattern 160 (See FIG. 8) to be formed in a subsequent process overlap with the organic light emitting layer 150 therebetween, as shown in FIG. 6A. In this case, the "organic light emitting layer" may be referred to as the "organic light emitting layer pattern," but hereinafter, the organic light emitting layer will be used to include both of these meanings.

The organic light emitting layer 150 is formed, for example, using a material in which a small molecule phosphorescent dopant such as tris(2-phenylpyridine)iridium (Ir(ppy)$_3$) is mixed with a small molecule phosphorescent matrix such as 4,4'-N,N'-dicarbazole-1,1'-biphenyl (CBP) or a polymer matrix such as poly-N-vinylcarbazole (PVK). In other embodiments, the organic light emitting layer 150 may be formed using a material in which a fluorescent dopant such as 4-dicyanomethylene-2-methyl-6-[2-(2,3,6,7-tetra-hydro-1H,5H-benzo[ij]quinolizin-8-yl)vinyl]-4H-pyran (DCM2) and 10-(2-benzothiazolyl)-1,1,7,7-tetramethyl-2,3,6,7-tetrahydro-1H,5H,11H(1)benzopyrano(6,7,8-ij)quinolizin-11-one (C545T) is mixed with a small molecule phosphorescent matrix or a polymer matrix. Ir(ppy)3 mostly emits green, DCM2 mostly emits red, and C545T mostly emits green.

Figure 7:
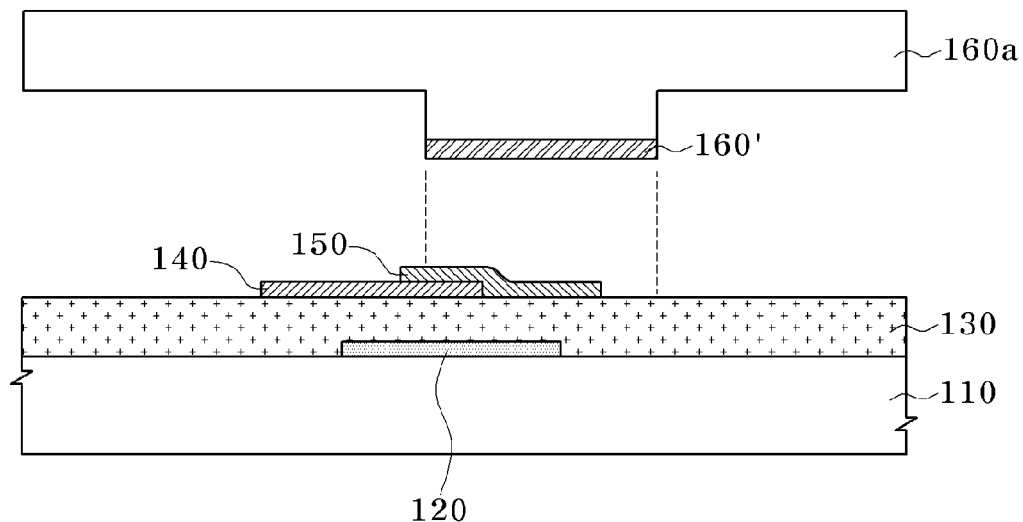
Figure 8:
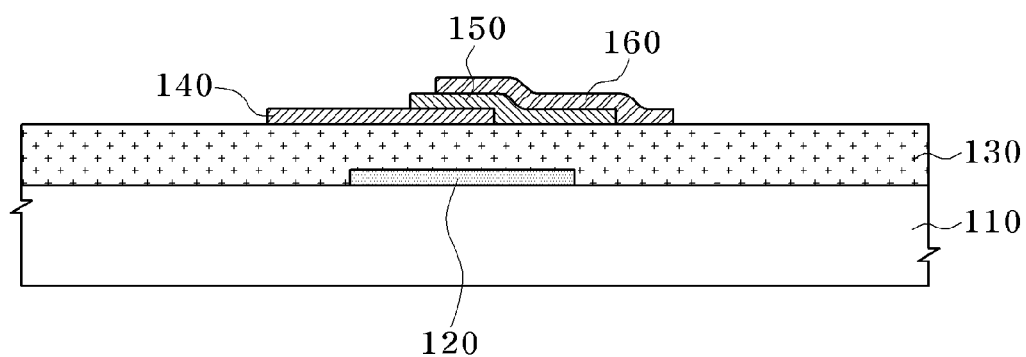

Referring to FIGS. 7 and 8, the electron transport layer pattern 160 is formed through printing to be in contact with at least a part of a surface of the organic light emitting layer 150. In some embodiments, the process of printing and forming the electron transport layer pattern 160 is performed by the transfer printing method in which a material 160' dissolved in an organic solvent to form the electron transport layer 160 is coated on a mold 160a and transferred, as shown in FIG. 7. In other embodiments, the process of printing and forming the electron transport layer pattern 160 is performed by the inkjet printing method, just like the aforementioned process of forming the hole transport layer pattern 140. In still other embodiments, the process of printing and forming the electron transport layer pattern 160 is performed, although not shown in the drawings, by the roll-to-roll printing method just like the aforementioned process of forming the hole transport layer pattern 140. In some embodiments, the material for forming the electron transport layer pattern 160 is a small molecular material such as C60 or a polymer which is dissolved in an organic solvent.

Figure 9:
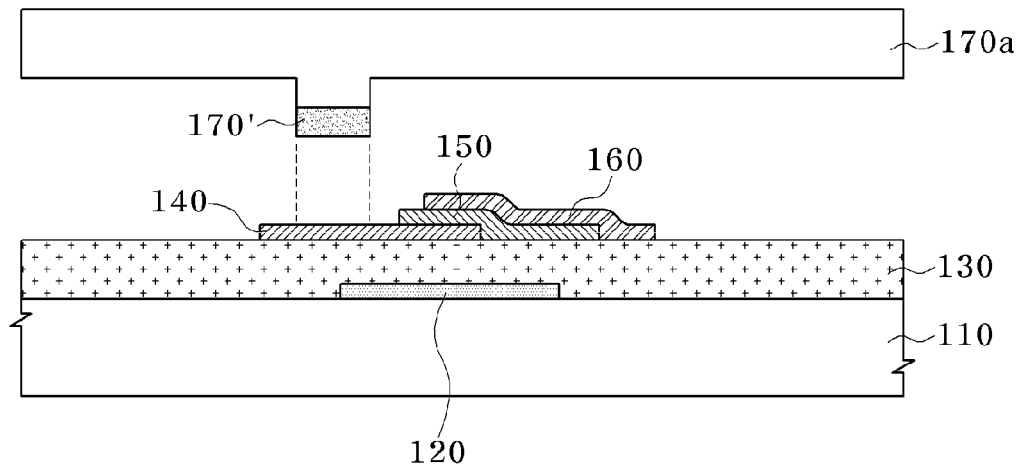
Figure 10:
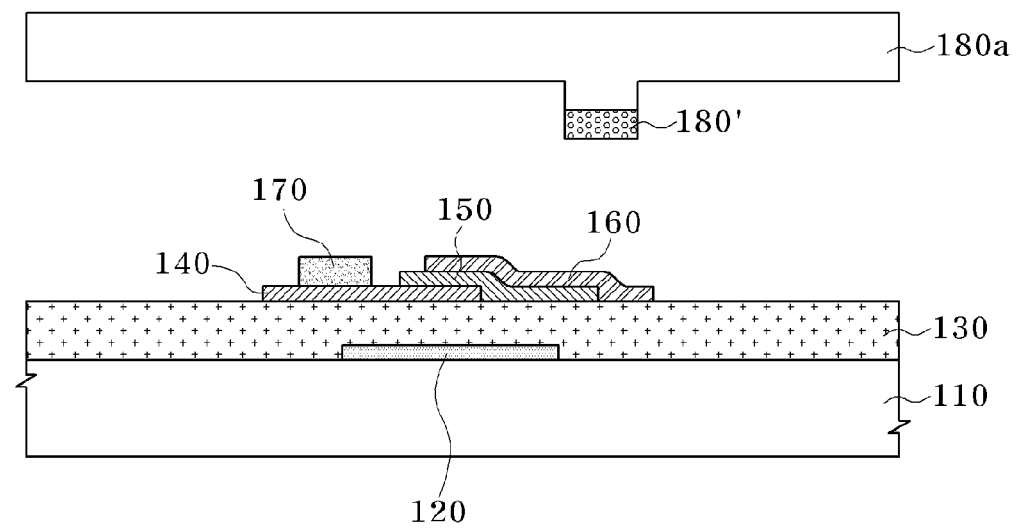
Figure 11:
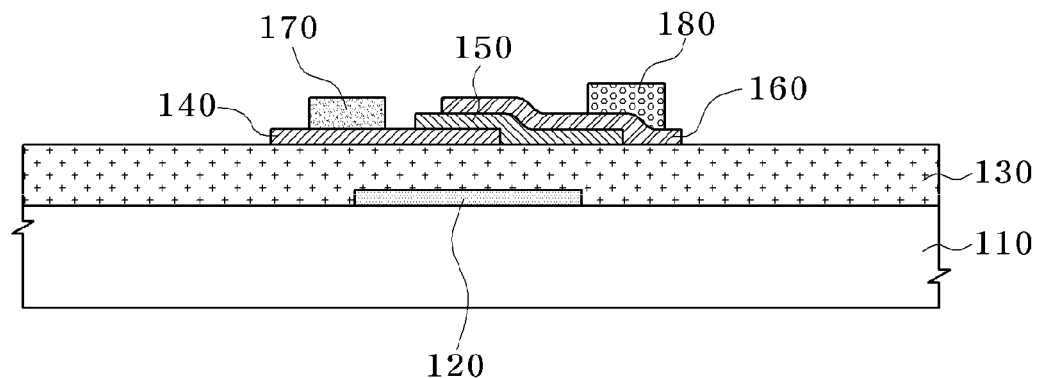

Referring to FIGS. 9 to 11, a first electrode 170 and a second electrode 180 are respectively formed on the hole transport layer pattern 140 and the electron transport layer pattern 160. In some embodiments, the first electrode 170 on the hole transport layer pattern 140 and the second electrode 180 on the electron transport layer pattern 160 are formed by performing the transfer printing method in which materials 170' and 180' to form respective electrodes are printed using respective molds 170a and 180a. In other embodiments, the first and second electrodes 170 and 180 are formed by a roll-to-roll printing method. In still other embodiments, the first and second electrodes 170 and 180 are formed by forming a thin film by a deposition method such as chemical vapor deposition (CVD), sputtering, and vacuum evaporation, and patterning the thin film, although not shown in the drawings. In some embodiments, the first electrode 170 and the second electrode 180 are respectively formed on the hole transport layer pattern 140 and the electron transport layer pattern 150 in both cases of forming the organic light emitting layer 150 on the entire surface and on a portion as shown in the drawings. In some embodiments, as shown in FIGS. 9 to 11, the first electrode 170 is formed, and then the second electrode 180 is formed. In other embodiments, although not shown in the drawings, the second electrode 180 is formed, and then the first electrode 170 is formed. In some embodiments, the first electrode 170 on the hole transport layer 140 is formed of Au. In other embodiments, the first electrode 170 is formed of Ag. In still other embodiments, the first electrode 170 is formed of ITO. In some embodiments, the second electrode 180 on the electron transport layer 160 is formed of a material which has a smaller work function than the first electrode 170. In other embodiments, the second electrode 180 is formed of Ca. In still other embodiments, the second electrode 180 is formed of Mg. In still other embodiments, the second electrode 180 is formed of Ba. In still other embodiments, the second electrode 180 is formed of an alkali metal. In still other embodiments, the second electrode 180 is formed of an alkali earth metal.

In this embodiment, it is described that the organic light emitting layer 150 and the electron transport layer pattern 160 are formed after the hole transport layer pattern 140 is formed. However, it is only for convenience of description, and although not shown in the drawings, it is possible for the organic light emitting layer 150 and the hole transport layer pattern 140 to be formed after the electron transport layer pattern 160 is formed When the OLED is fabricated using a printing method as such, the necessary processes may be reduced. Accordingly, manufacturing costs and time may be reduced, and thereby an economical advantage may be provided.

Figure 12:
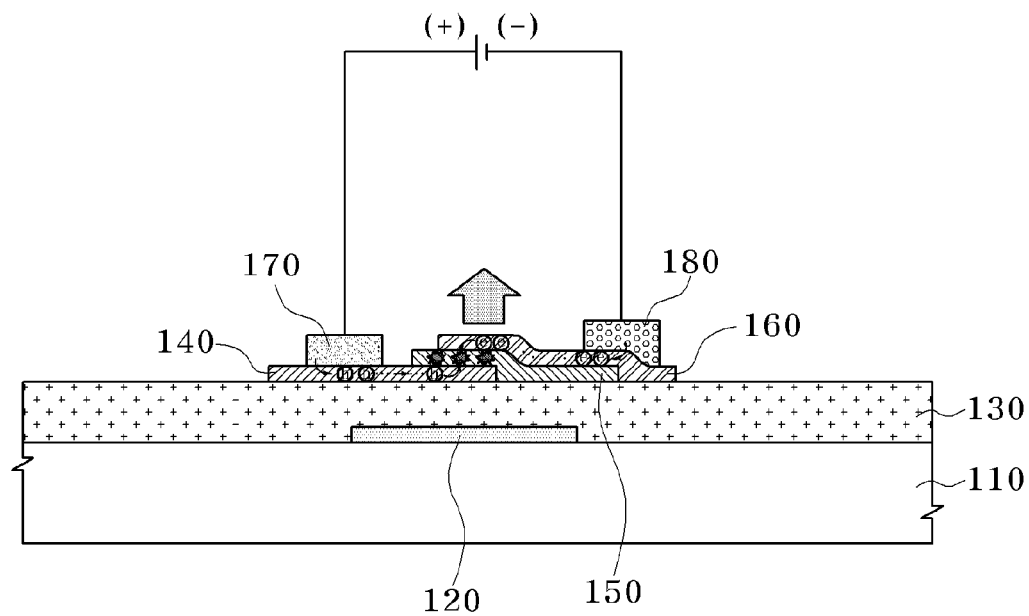
FIG. 12 is an overview for describing an operation of an organic light-emitting device according to an embodiment of the present invention.

FIGS. 11 and 12 are cross-sectional views for describing an OLED according to an embodiment of the present invention. Duplicate description which has been already described in the method of fabricating an OLED will be omitted for brevity of explanation. The OLED according to the embodiment of the present invention includes a control electrode 120 formed on a substrate, an insulating layer 130 covering at least a part of a top surface of the control electrode 120, a hole transport layer pattern 140 formed through printing over the control electrode 120 with the insulating layer 130 therebetween, an organic light emitting layer 150 in contact with at least a part of a surface of the hole transport layer pattern 140, an electron transport layer pattern 160 formed through printing over the control electrode 120 with the insulating layer 130 therebetween and in contact with at least a part of a surface of the organic light emitting layer 150, a first electrode 170 formed on the hole transport layer pattern 140, and a second electrode 180 formed on the electron transport layer pattern 160.

An operation of the OLED according to an embodiment of the present invention will be described with reference to FIGS. 11 and 12. A positive voltage is applied to the first electrode 170 formed on the hole transport layer pattern 140, and a negative voltage is applied to the second electrode 180 formed on the electron transport layer pattern 160. The first electrode 170 to which the positive voltage is applied injects holes into the hole transport layer 140, and the second electrode 180 to which the negative voltage is applied injects electrons to the electron transport layer 160.

The first electrode 170 is an electrode for hole injection and formed of a material to which holes are easily injected due to a high work function, and the second electrode 180 is an electrode for electron injection and formed of a material having a low work function. Since the second electrode 180 is formed of the material having the low work function, high current density can be obtained by lowering a barrier formed between the second electrode 180 and the organic light emitting layer 150, and thereby the light-emitting efficiency of the OLED may increase. In addition, since the first electrode 170 is formed of the material having the high work function, the reduction in efficiency due to non-radiative recombination near the first electrode 170 may be prevented. In some embodiments, the second electrode 180 is formed of a material having a lower work function than the first electrode 170. In other embodiments, the first electrode 170 is formed of at least one of ITO, Au, and Ag. In some embodiments, the second electrode 180 is formed of at least one of an alkali metal, an alkali earth metal, Ca, Ba, Mg, and Al. When the second electrode 180 is formed of a material such as an alkali metal or Ca, such a material has high efficiency due to a low work function but has high reactivity (for example, such a material is easily oxidized by oxygen or moisture in the air). Accordingly, a capping layer may be further formed on the second electrode 180 to suppress such reaction.

Holes injected into the hole transport layer pattern 140 are injected into the highest occupied molecular orbital (HOMO) corresponding to a valence band of a semiconductor device, electrons injected into the electron transport layer pattern 160 are injected into the lowest unoccupied molecular orbital (LUMO) corresponding to a conduction band of the semiconductor device, and holes and electrons injected into the organic light emitting layer 150 are respectively delocalized to pi-electrons according to pi-bonding in the polymer.

Such delocalized carriers are coupled with a lattice inside the organic light emitting layer 150 to form negative polarons, i.e. an electron-lattice, and positive polarons, i.e. a hole-lattice. New type carriers thus formed have corresponding energies at stabilized positions and move to the opposite electrode along polymer chains through hopping, etc. by an electric field applied from outside. Such moving carriers meet and bond together in the organic light emitting layer 150 to form excitons. The excitons which are formed have spin states of singlet and triplet. The ratio of the triplet excitons to the singlet excitons is 3:1. The triplets may lose 75% of efficiency due to low light-emitting efficiency. The excitons formed in this way generate lights corresponding to an energy gap and are extinguished.

Since hole mobility is greater than electron mobility within the polymer in such a light-emitting structure, the excitons are formed near electrons and the injection electrode, and thereby the light-emitting efficiency generally decreases. However, the OLED according to the embodiment of the present invention has the first electrode 170 and the second electrode 180 laterally formed on almost the same level, unlike in the related art in which the structure of the OLED is vertically formed. Accordingly, since the excitons are formed more spaced apart from the second electrode 180 to which the electrons are injected than in the related art, the light-emitting efficiency may increase.

In this way, since the light emission by hole-electron recombination is controlled by the control electrode 120 unlike an organic light-emitting diode of the related art, the OLED which is switched according to a signal applied to the control electrode 120 can be implemented. Therefore, the OLED according to the embodiment of the present invention enables faster switching than in the related art in which the OLED is switched using thin film transistor (TFT).

Although it is described in FIGS. 11 and 12 that the hole transport layer 140 is formed and then the organic light-emitting layer 150 followed by the electron transport layer 160 is formed, it is possible to form the electron transport layer 160, the organic light emitting layer 150, and then the hole transport layer 140 is formed, of course.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of fabricating an organic light-emitting device, comprising:
    providing a substrate;
    forming a control electrode on the substrate;
    forming an insulating layer covering at least a top surface of the control electrode;
    forming a hole transport layer pattern being in direct contact with a top surface of the insulating layer by printing on at least a part of the insulating layer, the hole transport layer pattern having first and second portions at a top surface of the hole transport layer pattern;
    forming an organic light-emitting layer having i) a first part being in direct contact with and overlapping with the first portion of the top surface of the hole transport layer pattern and ii) a second part arranged next to the hole transport layer pattern and being in direct contact with the insulating layer;
    forming an electron transport layer pattern by printing to be in direct contact with a part of a surface of the organic light-emitting layer, the electron transport layer pattern having iii) a first portion overlapping with the first part of the organic light-emitting layer and the first portion of the top surface of the hole transport layer pattern and iv) a second portion being in direct contact with and overlapping with the second part of the organic light-emitting layer;
    forming a first electrode directly on the second part of the top surface of the hole transport layer pattern; and
    forming a second electrode directly on the second portion of the electron transport layer pattern, wherein the second electrode is not overlapped with the first electrode when viewed from a top of the organic light-emitting device,
    wherein the hole transport layer pattern and the second portion of the electron transport layer pattern are arranged in parallel with the substrate such that an electron in the electron transport layer pattern and a hole in the hole transport payer pattern respectively moves in a direction parallel with the substrate when the organic light-emitting device is biased.

2. The method of claim 1, wherein the forming of the electron transport layer pattern is performed using C60.

3. The method of claim 1, wherein the forming of the hole transport layer pattern is performed using at least one of 6,13-bis(triisopropylsilylethynyl)pentacene (TIPS pentacene), poly(3-hexylthiophene) (P3HT), and poly(2,5-bis(3-tetradecylthiophen-2-yl)thieno[3,2-b]thiophene (PBTTT).

4. The method of claim 1, wherein the forming of the organic light-emitting layer is performed using a material in which at least one of a phosphorescent dopant and a fluorescent dopant is mixed with a small molecule matrix or a polymer matrix.

5. The method of claim 4, wherein the phosphorescent dopant material is tris(2-phenylpyridine)iridium (Ir(ppy)3), and the fluorescent dopant is at least one of 4-dicyanomethylene-2-methyl-6-[2-(2,3,6,7-tetrahydro-1H,5H-benzo[ij] quinolizin-8-yl)vinyl]-4H-pyran (DCM2) and 10-(2-benzothiazolyl)-1,1,7,7-tetramethyl-2,3,6,7-tetrahydro-1H,5H, 11H(1)benzopyrano(6,7,8-ij)quinolizin-11-one (C545T).

6. The method of claim 5, wherein the small molecule matrix is 4,4'-N,N'-dicarbazole-1,1'-biphenyl (CBP), and the polymer matrix is poly(N-vinylcarbazole).

7. The method of claim 1, wherein the forming of the organic light-emitting layer is performed using a printing method.

8. The method of claim 1, wherein the forming of the organic light-emitting layer includes forming a thin film using at least one of evaporation, spin coating, dip coating, doctor blade, and roll-to-roll printing.

9. The method of claim 1, wherein the second electrode is formed of a material having a lower work function than a work function of the first electrode.

10. The method of claim 1, wherein the forming of the first electrode is performed using at least one of Au, Ag, and indium tin oxide (ITO).

11. The method of claim 1, wherein the forming of the second electrode is performed using at least one of Ca, Ba, Mg, an alkali metal, and an alkali earth metal.

12. The method of claim 1, wherein the forming of at least one of the first electrode and the second electrode is performed using a printing method.

13. The method of claim 1, wherein the forming of at least one of the first electrode and the second electrode includes forming a thin film using at least one of chemical vapor deposition (CVD), sputtering, and evaporation, and patterning the thin film.

14. A method of fabricating an organic light-emitting device, comprising:
providing a substrate;
forming a control electrode on the substrate;
forming an insulating layer covering at least a top surface of the control electrode;
forming an electron transport layer pattern being in direct contact with a top surface of the insulating layer by printing on at least a part of the insulating layer, the electron transport layer pattern having first and second portions at a top surface of the electron transport layer pattern;
forming an organic light-emitting layer having i) a first part being in direct contact with and overlapping with the first portion of the top surface of the electron transport layer pattern and ii) a second part arranged next to the electron transport layer pattern and being in direct contact with the insulating layer;
forming a hole transport layer pattern through printing to be in direct contact with a part of a surface of the organic light-emitting layer, the hole transport layer pattern having iii) a first portion overlapping with the first part of the organic light-emitting layer and the first portion of the top surface of the electron transport layer pattern and iv) a second portion being in direct contact with and overlapping with the second part of the organic light-emitting layer;
forming a first electrode directly on the second part of the top surface of the electron transport layer pattern; and
forming a second electrode directly on the second portion of the hole transport layer pattern, wherein the second electrode is not overlapped with the first electrode when viewed from a top of the organic light-emitting device,
wherein the electron transport layer pattern and the second portion of the hole transport layer pattern are arranged in parallel with the substrate such that an electron in the electron transport layer pattern and a hole in the hole transport payer pattern respectively moves in a direction parallel with the substrate when the organic light-emitting device is biased.

15. The method of claim 14, wherein the forming of the electron transport layer pattern is performed using C60.

16. The method of claim 14, wherein the forming of the hole transport layer pattern is performed using at least one of 6,13-bis(triisopropylsilylethynyl)pentacene (TIPS pentacene), poly(3-hexylthiophene) (P3HT), and poly(2,5-bis(3-tetradecylthiophen-2-yl)thieno[3,2-b]thiophene (PBTTT).

17. The method of claim 14, wherein the forming of the organic light-emitting layer is performed using a material in which at least one of a phosphorescent dopant and a fluorescent dopant is mixed with a small molecule matrix or a polymer matrix.

18. The method of claim 17, wherein the phosphorescent dopant material is tris(2-phenylpyridine)iridium (Ir(ppy)3), and the fluorescent dopant is at least one of 4-dicyanomethylene-2-methyl-6-[2-(2,3,6,7-tetrahydro-1H,5H-benzo[ij]quinolizin-8-yl)vinyl]-4H-pyran (DCM2) and 10-(2-benzothiazolyl)-1,1,7,7-tetramethyl-2,3,6,7-tetrahydro-1H,5H, 11H(1)benzopyrano(6,7,8-ij)quinolizin-11-one (C545T).

19. The method of claim 18, wherein the small molecule matrix is 4,4'-N,N'-dicarbazole-1,1'-biphenyl (CBP), and the polymer matrix is poly(N-vinylcarbazole).

20. The method of claim 14, wherein the forming of the organic light-emitting layer is performed using a printing method.

21. The method of claim 14, wherein the forming of the organic light-emitting layer includes forming a thin film using at least one of evaporation, spin coating, dip coating, doctor blade, and roll-to-roll printing.

22. The method of claim 14, wherein the second electrode is formed of a material having a lower work function than a work function of the first electrode.

23. The method of claim 14, wherein the forming of the first electrode is performed using at least one of Au, Ag, and indium tin oxide (ITO).

24. The method of claim 14, wherein the forming of the second electrode is performed using at least one of Ca, Ba, Mg, an alkali metal, and an alkali earth metal.

25. The method of claim 14, wherein the forming of at least one of the first electrode and the second electrode is performed using a printing method.

26. The method of claim 14, wherein the forming of at least one of the first electrode and the second electrode includes forming a thin film using at least one of chemical vapor deposition (CVD), sputtering, and evaporation, and patterning the thin film.

* * * * *